United States Patent
Takano

[11] Patent Number: 5,524,089
[45] Date of Patent: Jun. 4, 1996

[54] LOGARITHM COMPUTING CIRCUIT FOR FIXED POINT NUMBERS

[75] Inventor: Hideto Takano, Tokyo, Japan

[73] Assignee: NEC Corporatiion, Japan

[21] Appl. No.: 156,447

[22] Filed: Nov. 23, 1993

[30] Foreign Application Priority Data

Dec. 4, 1992 [JP] Japan ................................. 4-325120

[51] Int. Cl.⁶ .............................. G06F 7/00; G06F 15/00; H03M 7/50
[52] U.S. Cl. .......................................... 364/748.5; 341/75
[58] Field of Search ................................ 364/748.5, 722, 364/715.03; 341/75

[56] References Cited

U.S. PATENT DOCUMENTS 4,626,825  12/1986  Burleson et al. .......................... 341/75
5,301,138  4/1994  Lindsley .............................. 364/748.5

Primary Examiner—Roy N. Envall, Jr.
Assistant Examiner—Emmanuel L. Moise
Attorney, Agent, or Firm—Whitham, Curtis, Whitham & McGinn

[57] ABSTRACT

A logarithm computing circuit for fixed point numbers is disclosed that has: a shift number detection circuit that inputs a number of a fixed point representation, detects a shift number of the inputted number for the purpose of dividing the inputted number into an exponent part and a mantissa part, calculates an exponent part from the shift number and a radix point position of the inputted number, subtracts 1 from the exponent part, and finally outputs the subtraction result as an integer part; a shift circuit that normalizes the inputted number by shifting the inputted number a number of bits equal to the shift number and generates a mantissa part that is equal to or above 0.5 and below 1; and a decimal-part computing circuit that converts the mantissa part to its logarithm to base 2, adds 1 to the conversion result and outputs the result as a decimal part.

14 Claims, 2 Drawing Sheets

LOGARITHM COMPUTING CIRCUIT FOR FIXED POINT NUMBERS

BACKGROUND OF THE INVENTION

1. Field of the Invention

The present invention relates to a logarithm computing circuit, and particularly to a logarithm computing circuit that computes a logarithm to base 2 of a number of a fixed point representation.

2. Description of the Related Art

In a logarithm computing circuit that performs base-2-logarithmic conversion (conversion to a logarithm to base 2), an inputted value N (N>0) is divided into an exponent part Ne and a mantissa part Nm.

$$N = N_m \cdot 2^{N_e} \quad (N_e \text{ is an integer, and } -1 < N_m < 1) \tag{1}$$

Logarithmic calculation for this N has conventionally been performed as follows:

$$\begin{aligned} \text{Log}_2 N &= \text{Log}_2 (N_m \cdot 2^{N_e}) \\ &= N_e + \text{Log}_2 N_m \end{aligned} \tag{2}$$

In other words, the logarithmic conversion of N can be carried out by performing the base-2-logarithmic conversion of the mantissa part $N_m$ and adding the logarithmic-converted value and the exponent part $N_e$. All discussion hereinafter will assume that 2 is taken as the base.

In cases in which an inputted N is represented by a fixed point system, the calculation of formula (2) is carried out as follows: Assuming the most significant bit is a sign bit, the numeral of each bit of inputted N is first shifted in the direction of the most significant bit with the radix point fixed as is until the bit following the most significant bit becomes 1. Here, the number of bits the inputted N is shifted is noted as a shift number p. Next, the radix point is shifted to a position between the most significant bit and the next bit (hereinafter referred to as the normal position). Here, the bit number of the shift made by the radix point is noted as a correction number q. Through these operations, the inputted N is converted to a form wherein the radix point is at the normal position and the bit following the most significant bit is 1. This form will hereinafter be noted as the normal form of inputted N, and the process by which inputted N is converted to the normal form will be noted as normalization. The shift of shift number p is equivalent to multiplying the input N by $2^p$, and the radix point shift of correction number q is equivalent to multiplying the input N by $2^{-q}$. Consequently, normalization of input N corresponds to multiplying the input N by $2^{p-q}$. When input N is represented in the form of formula (1), mantissa part $N_m$ is the normalized form of input N, and $N_e$ of formula (1) becomes equal to q-p. For this reason, the calculation of formula (2) is realized by making q-p the exponent part $N_e$, making the normal form of input N the mantissa part $N_m$ and finding the logarithm $\log_2 N_m$, and calculating the sum of the two.

Consequently, when the fixed point of input N is at the normal position (q=0), -p is equal to the value of the exponent part $N_e$. When the fixed point of input N is displaced from the normal position by just q digits, the exponent part $N_e$ becomes the integer -(p-q) obtained by correcting the shift number p by the correction number q. For example, in a case in which the fixed point of input N lies between the eighth and ninth bit from the most significant bit, the correction number is 7, and the value obtained by subtracting the shift number from this correction number is equal to the exponent part.

When the input value is, for another example, 1.5 (00000001.100... in binary number representation), 6 shifts in the direction of the most significant bit are necessary before the bit following the most significant bit becomes 1, and for this reason, the shift number is 6, and the input value is converted to 01100000.000... in binary representation by the six-bit shift. Next, the position of the radix point is shifted seven times in order to effect the normalization, whereby the mantissa value becomes 0.75 (0.110000... in binary representation). Consequently, the logarithmic conversion of 1.5 as defined to base 2 can be obtained according to the following formula:

$$\begin{aligned} \text{Log}_2 1.5 &= (7-6) \text{Log}_2 0.75 \\ &\approx 0.585 \end{aligned} \tag{3}$$

FIG. 1 is a block diagram showing a conventional circuit that realizes the base-2 logarithm computing circuit in accordance with the above method. FIG. 2 is a block diagram showing the shift number detection circuit 7 of FIG. 1.

The logarithm computing circuit is composed of a shift number detector 7, a shifter 2, a base-2-logarithmic converter 8, and an adder 9, and as shown in FIG. 2, the shift number detector 7 is made up of a bit position detector 4, a shift number converter 5, and an exponent part converter 10.

In FIG. 1, input 101 is a number in fixed point representation supplied for the purpose of performing logarithm computation. The shift number detector 7 establishes a shift number 102 for the purpose of performing normalization of the input 101, and also performs correction of the shift number with the radix point position, thereby providing an exponent value 106. Here, the bit position detector 4 detects the first bit position of binary 1 as viewed from the side of the most significant bit of the input 101. The exponent part converter 10 outputs the exponent value 106. The shift number converter 5 outputs the shift number 102.

In FIG. 1, the shifter 2 receives the input 101 and the shift number 102 delivered from the shift number detector 7, and in accordance with the shift number, carries out normalization of the input 101 and outputs the mantissa part 103. The range of the value of this mantissa part can be expressed as follows:

$$0.5 \leq \text{mantissa value} < 1 \tag{4}$$

This mantissa part 103 is converted to its base-2 logarithm by means of the logarithmic converter 8. As a result, the range of the output 107 of the logarithmic converter 8 is given by the following formula:

$$-1 \leq \text{logarithmic converter output} < 0 \tag{5}$$

This logarithmic converter output 107 is added to the exponent part 106 supplied from the shift number detector 7 by the adder 9, which provides logarithmic conversion output 108. In this addition process, because the exponent part 106 is an integer value, a carry operation resulting from the addition occurs only when the output 107 of the logarithmic converter 8 is −1. Accordingly, the adder 9 is necessary only for addition of logarithmic converter output that is equal to −1, and is essentially unnecessary for any other purposes, because, when the output 107 of the logarithmic converter 8 is not equal to −1, the numerical representation of the sum of the exponent part 106 and the logarithmic converter output 107 is obtained without any substantial addition calculation by simply arranging the output 107 in line with the exponent part 106. Nevertheless, conventional logarithm computing circuits are provided with adders for carrying out only the addition of −1, giving rise to the problem of poor efficiency of the circuit structure.

SUMMARY OF THE INVENTION

The purpose of the present invention is to solve the above-described problems and provide a logarithm computing circuit having superior efficiency in terms of circuit structure. This purpose is achieved by the logarithm computing circuit of the present invention.

The logarithm computing circuit of the present invention comprises:

shift number detection means that inputs a number of a fixed point representation, detects a shift number of the inputted number in order to divide the inputted number into an exponent part and a mantissa part, calculates the exponent part from the shift number and a radix point position of the inputted number, subtracts 1 from the exponent part, and finally outputs the subtraction result as an integer part;

shift means that normalizes the inputted number by shifting the inputted number a number of bits equal to the shift number and generates a mantissa part that is equal to or above 0.5 and below 1; and decimal-part computing means that converts said mantissa part to the logarithm thereof to base 2, adds 1 to the conversion result, and outputs the result as a decimal part, wherein the shift number refers to a number of bits the inputted number is shifted in order to normalize the inputted number.

The shift number detection means comprises: bit position detection means that detects the first bit position of binary 1 as viewed from the side of the most significant bit of the inputted number and outputs the result as bit position information; shift number conversion means that receives said bit position information and establishes the shift number for normalizing said inputted number; integer part conversion means that receives said bit position information, calculates the decimal part from the shift number and the radix point position of the inputted number, subtracts 1 from the value of the decimal part, and outputs the subtraction result as an integer part.

The above and other objects, features, And advantages of the present invention will become apparent from the following description referring to the accompanying drawings which illustrate an example of a preferred embodiment of the present invention.

DETAILED DESCRIPTION OF THE PREFERRED EMBODIMENTS

Figure 1:
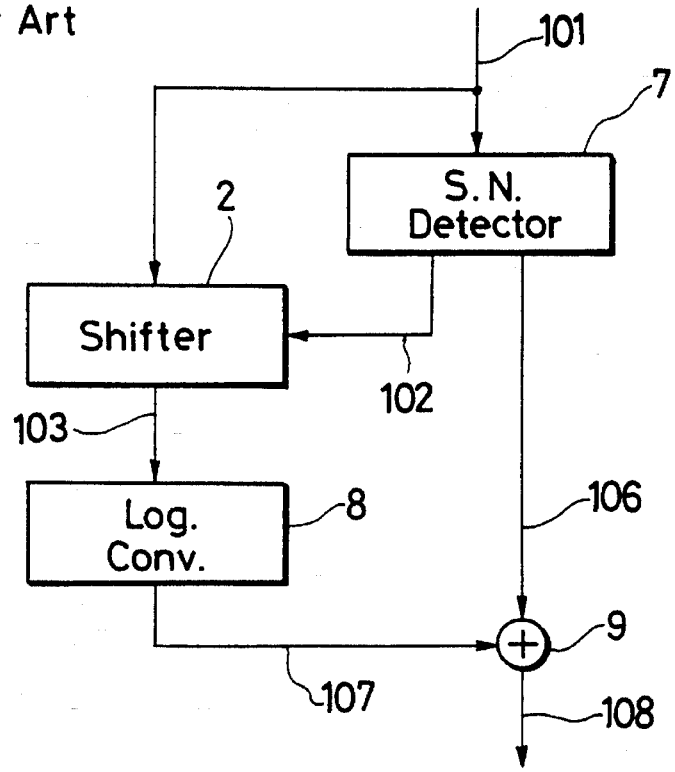
FIG. 1 is a block diagram of a logarithm computing circuit of the prior art.
Figure 2:
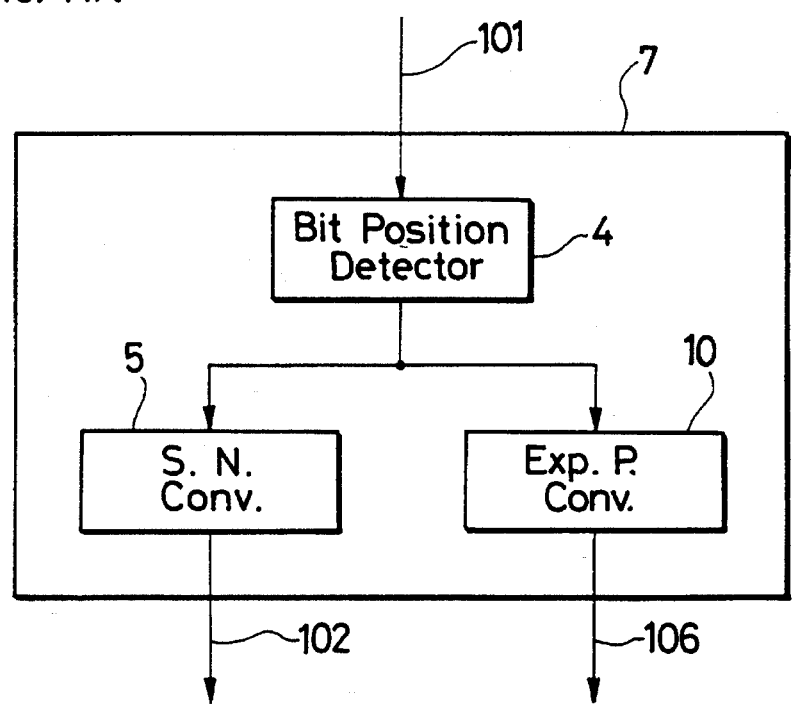
FIG. 2 is a block diagram of a shift number detector of FIG. 1.
Figure 3:
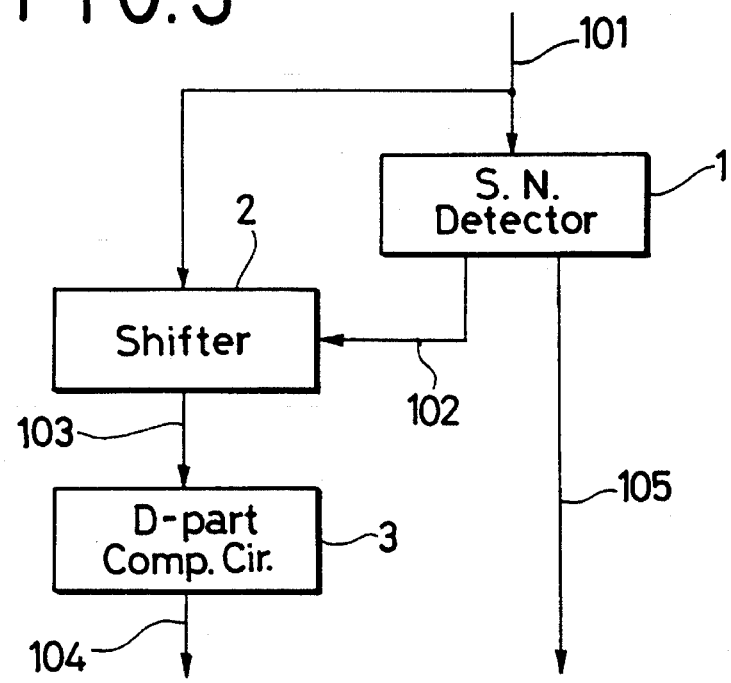
FIG. 3 is a block diagram of an embodiment of the logarithm computing circuit of the present invention.

FIG. 3 is a block diagram showing an embodiment of the present invention. As shown in FIG. 3, the present embodiment is made up of a shift number detector 1, a shifter 2, and a decimal-part computing circuit 3; and as shown in FIG. 4, the shift number detector 1 is made up of a bit position detector 4, a shift number converter 5, and an integer part converter 6.

In FIG. 3, the input 101 is the number of the fixed point representation supplied for performing logarithmic computation, and the shift number detector 1 detects and outputs the shift number 102 in order to normalize the input 101, and in addition, performs correction of the shift number 102 with the radix point position by means of the following formula and outputs the result as the integer part 105:

$$\text{(integer part 105)} = \text{correction number} - \text{(shift number 102)} - 1 \tag{6}$$

Figure 4:
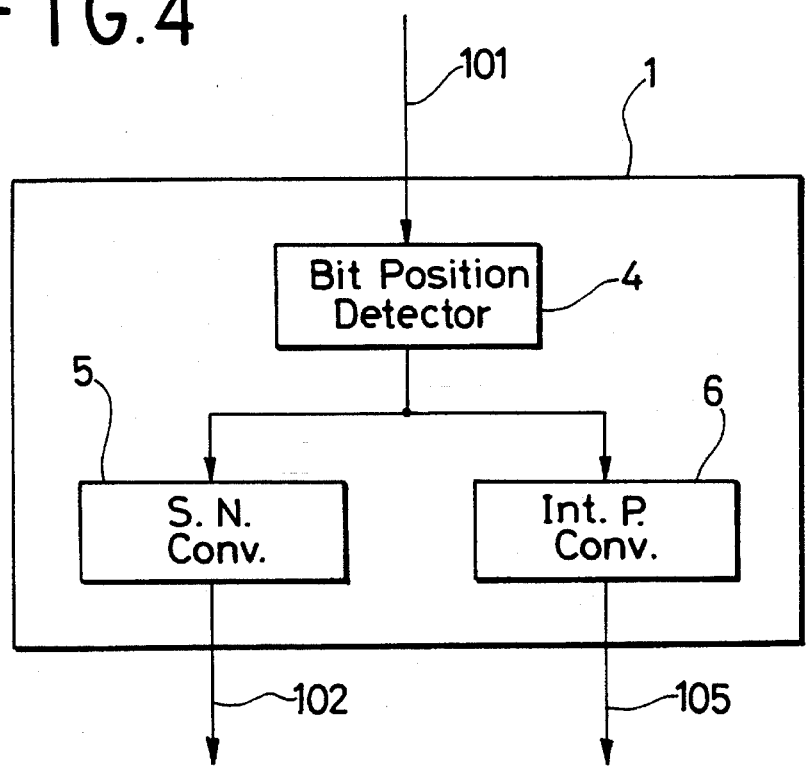
FIG. 4 is a block diagram of the shift number detector of FIG. 3.

FIG. 4 is a block diagram showing the internal structure of the shift number detector 1 of the present embodiment. As shown in FIG. 4, the shift number detector 1 is provided with a bit position detector 4, a shift number converter 5, and an integer part converter 6. The bit position detector 4 receives input 101 and detects the first bit position of binary 1 as viewed from the side of the most significant bit of the input 101. The integer part converter 6 generates an integer part 105 from the bit position and the correction number, and the shift number converter 5 outputs the shift number 102.

In FIG. 3, the shifter 2 receives the input 101 and the shift number 102 delivered from the shift number detector 1, shifts the input 101 in the direction of the most significant bit, and outputs a mantissa value 103. The mantissa value 103 is supplied to the decimal-part computing circuit 3. This mantissa value 103 has a radix point situated between the most significant bit and the next bit. The decimal-part computing circuit 3 converts the mantissa value 103 according to the following formula and outputs the converted value as decimal part 104.

$$\text{(decimal part 104)} = \text{Log}_2\text{(mantissa value)} + 1 \tag{7}$$

The conversion at the decimal-part computing circuit 3 is performed using a table written to ROM. Because the conversion result of the decimal-part computing circuit 3 is always a positive value, there is no sign bit. In this way, the integer part 105 of the logarithmic computation result and the decimal part 104 are each found as the outputs of the shift number detector 1 and the decimal-part computing circuit 3. As a result, the infrequently used adder can be eliminated, enabling a reduction in the scale of the circuit.

It is to be understood that although the characteristics and advantages of the present invention have been set forth in the foregoing description, the disclosure is illustrative only, and changes may be made in the arrangement of the parts within the scope of the appended claims.

What is claimed is:

1. A logarithm computing circuit for fixed point numbers comprising:

shift number detection means for inputting a number of a fixed point representation, detecting a shift number of the inputted number in order to divide the inputted number into an exponent part and a mantissa part, calculating the exponent part from the shift number and a radix point position of the inputted number, subtracting 1 from the exponent part, and finally outputting the subtraction result as an integer part;

shift means for normalizing the inputted number by shifting said inputted number a number of bits equal to said shift number and generating a mantissa part that is equal to or above 0.5 and below 1; and decimal-part computing means for converting said mantissa part to a logarithm thereof to base 2, adding 1 to the result of conversion regardless of a value of said result of conversion, and outputting the result as a decimal part, wherein said shift number refers to a number of bits the inputted number is shifted in order to normalize the inputted number.

2. The circuit as claimed in claim 1 wherein the shift number detection means comprises:

- bit position detection means for detecting the first bit position of binary 1 as viewed from the side of the most significant bit of the inputted number and for outputting the result as bit position;
- shift number conversion means for receiving said bit position information, and for establishing a shift number for normalizing said inputted number; and
- integer part conversion means for receiving said bit position information, calculating the exponent part from the shift number and the radix point position of the inputted number, subtracting 1 from the exponent part, and outputting the subtraction result as an integer part.

3. The circuit as claimed in claim 2, wherein said decimal-part computing means converts said mantissa part to a logarithm thereof to base 2 using a table written in a read-only memory coupled to said decimal-part computing means.

4. The circuit as claimed in claim 2, wherein said result of conversion produced by said decimal-part computing means always has a positive value.

5. The circuit as claimed in claim 2, wherein said result of conversion produced by said decimal-part computing means is an unsigned number.

6. The circuit as claimed in claim 2, wherein said decimal-part computing means converts said mantissa part to a logarithm thereof to base 2 using a table written in a read-only memory coupled to said decimal-part computing means.

7. The circuit as claimed in claim 6, wherein said result of conversion produced by said decimal-part computing means always has a positive value.

8. The circuit as claimed in claim 7, wherein said result of conversion produced by said decimal-part computing means is an unsigned number.

9. The circuit as claimed in claim 1, wherein said decimal-part computing means converts said mantissa part to a logarithm thereof to base 2 using a table written in a read-only memory coupled to said decimal-part computing means.

10. The circuit as claimed in claim 1, wherein said result of conversion produced by said decimal-part computing means always has a positive value.

11. The circuit as claimed in claim 1, wherein said result of conversion produced by said decimal-part computing means is an unsigned number.

12. The circuit as claimed in claim 1, wherein said decimal-part computing means converts said mantissa part to a logarithm thereof to base 2 using a table written in a read-only memory coupled to said decimal-part computing means.

13. The circuit as claimed in claim 12, wherein said result of conversion produced by said decimal-part computing means always has a positive value.

14. The circuit as claimed in claim 13, wherein said result of conversion produced by said decimal-part computing means is an unsigned number.

* * * * *